United States Patent [19]

Ward et al.

[11] Patent Number: 4,563,587
[45] Date of Patent: Jan. 7, 1986

[54] FOCUSED ION BEAM MICROFABRICATION COLUMN

[75] Inventors: J. William Ward, Canoga Park; Victor Wang, Agoura; Richard P. Vahrenkamp, Newberry Park; Robert L. Seliger, Agoura, all of Calif.

[73] Assignee: Hughes Aircraft Company, El Segundo, Calif.

[21] Appl. No.: 482,745

[22] Filed: Apr. 7, 1983

Related U.S. Application Data

[63] Continuation of Ser. No. 267,237, May 26, 1981, abandoned.

[51] Int. Cl.⁴ .................. H01J 37/30; H01J 37/317
[52] U.S. Cl. ........................ 250/396 R; 250/492.2
[58] Field of Search ............ 250/396 R, 492.2, 492.3, 250/307, 398, 423 R, 281, 294, 296; 313/359.1, 361.1

[56] References Cited

U.S. PATENT DOCUMENTS

| | | | |
|---|---|---|---|
| 2,877,341 | 3/1959 | Edgerton | 313/36 |
| 3,370,167 | 2/1968 | Sterk | 250/306 |
| 3,547,074 | 12/1970 | Hirschfeld | 250/398 |
| 3,585,397 | 6/1971 | Brewer | 250/492.3 |
| 3,786,359 | 1/1974 | King | 250/492.2 |
| 3,937,958 | 2/1976 | Rusch et al. | 250/307 |
| 4,085,330 | 4/1978 | Wolfe | 250/398 |
| 4,315,153 | 2/1982 | Vahrenkamp | 250/281 |

OTHER PUBLICATIONS

Krohn, "Ion Source of High Brightness Using Liquid Metal," Appl. Phys. Lttrs., 27 (9), 11-1-75, pp. 479-481.
Kendo, "Ion Microprobe with Wein Filter for Primary Ion Mass Separation," Mass Spectroscopy, 22 (3), Sep. 1974, pp. 229-230.
"A High Intensity Scanning Ion Probe with Submicrometer Spot Size," Seliger et al., Appl. Phys. Lett. 34 (5), Mar. 1, 1979.

Primary Examiner—Bruce C. Anderson
Assistant Examiner—Paul A. Guss
Attorney, Agent, or Firm—Gregory D. Ogrod; A. W. Karambelas

[57] ABSTRACT

Focused ion beam microfabrication column (10) produces an ion beam from ion source (12), focuses the beam by objective lens (24) onto the plane of electrode (36). ExB filter (44) separates out the ion species at a low energy portion of the beam. The beam of selected species is first accelerated by energy central lens (38) which has a controllable potential for controlling the final beam energy to the target. The beam is accelerated by final accelerator lens (54) and is demagnified and focused on the target by that lens. Beam deflector (64) deflects the beam for programmed ion beam work on the target (60).

5 Claims, 4 Drawing Figures

FOCUSED ION BEAM MICROFABRICATION COLUMN

The Government of the United States of Amercia has rights in this invention pursuant to Contract No. 116870.

This is a continuation of application Ser. No. 267,237, filed May 26, 1981, now abandoned.

BACKGROUND OF THE INVENTION

This invention is directed to a device for producing a mass separated ion beam which is finely focused and which has selectable energy. This direct-write ion beam may be used for directly writing on a semiconductor target to produce a semiconductor device without the use of masks.

Conventional ion implantation has emerged from research into manufacturing. In the conventional ion implantation, a broad approximately 1 cm in diameter ion beam is raster scanned over a wafer to create a uniformly implanted layer. Pattern definition is achieved through conventional masking (as by lithography) which involves a thin film of silicon dioxide or sometimes metal over the substrate.

Using focused ion beams is an elegant technique for microfabrication in that it eliminates conventional masking and wet process steps. The basic idea behind the focused ion beam is the elimination of all masking steps. The beam should therefore be focused sufficiently so that implantation patterns can be written by programming the beam deflection and blanking the beam. Prior effort at providing a finely focused ion beam with sufficient energy for implantation was not successful. Prior effort by R. L. Seilger and W. P. Fleming, as published March 1974 in the *Journal of Applied Physics,* Volume 45 Number 3, produced microprobes with about 5 micrometer spot diameter and with a maximum beam energy of about 60 kV. Such beams had current which was too low for most applications. Another example of early work is George Brewer, U.S. Pat. No. 3,585,397. Brewer was unable to provide a high brightness, small diameter ion source. Instead, Brewer flooded ions onto a small aperture and imaged the aperture at the target. In that structure the ion current was too low to be useful for practical implantation. Thus, there have been no devices capable of satisfactory direct writing ion implantation beams of sufficient current and sufficiently small diameter at the target for use in modern day semi-conductor development and manufacture.

SUMMARY OF THE INVENTION

In order to aid in the understanding of this invention it can be stated in essentially summary form that it is directed to a focused ion beam microfabrication device wherein an ion source produces ions from a sufficiently small spot and with sufficiently high intensity that the beam can be separated, focused, accelerated, and deflected onto a target. By such a structure, a computer can control the beam for implantation, mask exposure, ion beam machining and similar integrated circuits semiconductor processes to produce a unique integrated circuit in accordance with the programming of the controlling computer.

It is thus a purpose and advantage of this invention to provide a column which produces a focused and separated ion beam for unique intergrated circuit fabrication in accordance with computer control.

It is another purpose and advantage of this invention to provide a focused ion beam microfabrication device which has a high ion current density in a sufficiently small spot size for direct implantation. It is a further advantage of the ion beam device of this invention to provide a beam of selectable energy and of selectable ion species and provide purer ion species in the beam. These advantages accrue from the use of a liquid metal ion source, electrostatic lenses and deflectors and an ExB mass separator in the column.

It is another purpose and advantage of this invention to provide a focused ion beam microfabrication device which is useful in the field of semiconductor and integrated circuit fabrication particularly by providing a small dimension high resolution small scanning ion spot. It is a further advantage of this device to provide flexibility in implantation because all pattern information is stored in the software which controls the scanning spot to provide a simple and elegant implantation process with fewer steps because no masks are required. It is another advantage to provide such a device wherein integrated circuit devices can be produced by an all dry (no masking and etching) method. It is a further advantage to provide such a device which is useful as a small spot, high current microprobe and is also useful for resist exposure in conventional wet processing integrated circuit work.

Other purposes and advantages of this invention will become apparent from a study of the following portion of this specification, the claims and the attached drawings.

DESCRIPTION OF THE PREFERRED EMBODIMENT

Figure 3:
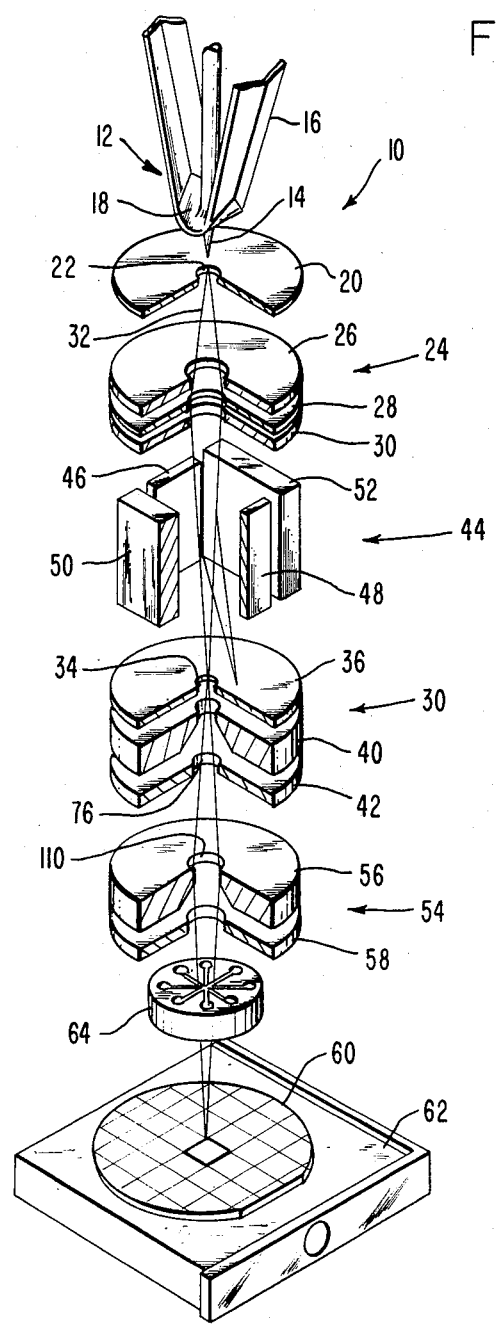
FIG. 3 is a schematic diagram of the functional portions of the column, with the elements thereof taken in section and broken away to the axis of the beam.

The schematic drawing of FIG. 3 illustrates the interrelationship of the various elements of the focused ion beam microfabrication column 10 of this invention.

Ion source 12 is a high brightness ion source which produces a beam of charged particles that appear to emanate from a very small point. Ion source 12 has a sharp point 14 which extends through the apex of hairpin shaped heater 16. Metal 18 is placed within the hairpin and is melted by the heater. The metal 18 is the feed metal which supplies the ions. The feed metal may be an element or alloy containing the desired species. By capillarity, the metal moves to the point 14 where it is ionized in the electric field. This high brightness ion source produces a beam of charged particles that appear to emanate from a very small point. Gallium is often used as an ion source to produce gallium ions for use in a column of this type.

Extraction electrode 20 has a central beam opening 22 on the axis of the beam, as seen in FIG. 3.

The optical design of the column 10 separates its function into physically separate regions. The results of the structure which are new and unique to this design are mass separation, variable beam energy and high final beam energy in a single compact column structure. Mass separation requires a transverse magnetic field which is a potential source of focusing aberration. To minimize this aberration, the magnetic field strength in the separator is minimized. To accomplish mass separation with minimum magnetic field, it is performed at the lowest beam energy, at beam extraction potential. The best use of the separator strength is obtained by positioning the separator slit at the beam focus or cross-over where the greatest resolution between ion species is available.

Objective lens 24 is in the form of an einzel lens having electrodes 26, 28 and 30. These three electrodes each also have a beam opening through the center thereof on the beam axis. The objective lens 24 was chosen to be an einzel lens so that the beam energy was not increased before the mass separator. Objective lens 24 is intended to operate in the accelerating mode, in which the ions are accelerated between electrodes 26 and 28 and are decelerated to the input energy level between electrodes 28 and 30. Operating objective lens 24 in the accelerating mode has lower aberration than if it would be operated in the decelerating case, but the accelerating mode requires a greater electric field strength. Ion source 12 is placed as close as possible to lens 24 to minimize aberration. Ion beam 32 has been extracted by electrode 20 and is magnified and focused by objective lens 24. It is focused with a beam crossover at the analyzer opening 34 in aperture plate 36 above energy control lens 38. Magnification of the spot at plate 36 provides a longer space between lens 24 and aperture plate 36 so that there is room for filter 44. Energy control lens 38 has first and second electrodes 40 and 42, also with openings on the beam axis.

ExB mass separator 44 is positioned along the beam path between objective lens 24 and energy control lens 38. As described, the beam is at low, extraction energy at this position and thus an ExB filter of minimum strength of magnetic and electric fields is possible. In this structure, the desired species is passed by the separator with minimum aberration in a straight line. In addition the small diameter at the beam substantially reduces the aberration, as compared to a larger beam. Beam opening 34 in the aperture plate 36 serves as the separation slit. As previously indicated, beam opening 34 is located at the first beam crossover which is the narrow beam waist at focus, and thus a minimum size aperture at that point is possible. In mass separator 44, electric field plates 46 and 48 are positioned parallel to each other, parallel to the center line axis of the column, which is in the beam path, and facing each other as indicated. Magnetic pole pieces 50 and 52 are connected by a magnetic field producing device. A permanent magnet is preferred, but an electric coil producing a magnetic field can be employed. The pole pieces are of the same length and the direction of the beam as the electric field plates 46, 48. The combined results are such that an ion of the selected species passes straight through, and passes through beam opening 34 while an ion of another species is deflected. Variation of the electric and magnetic fields across the diameter of the beam can introduce aberrations in the beam. In order to limit these aberrations, the beam must be narrow and the magnetic pole pieces and electric field plates may be flat and parallel or specially shaped to control the fields. Also, the width of these elements should be much larger than the beam diameter so that lateral fringe-field effects are small. Furthermore, the entrance and exit to the field zone must be carefully controlled because of fringe-fields at the ends.

Energy control lens 38 comprised of elements 40 and 42 is used to vary the beam energy entering the final accelerating lens 54. The image of the source 12 is focused by einzel lens 24 and is positioned near the principal plane of energy control lens 38. The principal plane and focus are about at the level of separator plate 36. With this focus or beam cross-over, the beam appears to emanate from energy control lens 38 with no focusing affect and only a change in energy. By simultaneously adjusting the final lens voltage together with the energy control lens voltage so that the lens voltage ratio is nearly constant, the beam will remain in focus at the target as the final beam energy is varied. A conventional acceleration gap not located at beam crossover will introduce a focus effect which would change with voltage. This would change the operating conditions of the following lenses, typically requiring change in position of the final focal plane.

Final accelerator lens 54 has electrodes 56 and 58 which apply the accelerating voltage to the ion beam. The lens also focuses and demagnifies the diverging beam from the energy control lens 38 onto the target. The demagnifying by this lens produces the small beam spot on the target. In the present case the target is semiconductor wafer 60 which is mounted on stage 62. The stage can be moved so that different areas of the semiconductor wafers can be acted upon by the beam. Translation of the beam is produced by beam deflector 64 which is positioned around the beam between the final accelerator lens 54 and target 60. The beam deflector is electrostatic, and may have four poles. In the present case, eight poles are employed. Beam deflection and acceleration are controlled by a suitable program, such as a computer program, so that the desired pattern is traced on the target by the beam. It is thus seen that the basic concept is a three lens design for selectable acceleration and fixed focus of the ion beam. The position of the energy control lens 38 at the focal point of objective lens 24, and the mass separator 44 between the extraction electrode 20 and energy control lens 38 is the basic structural concept.

Figure 4:
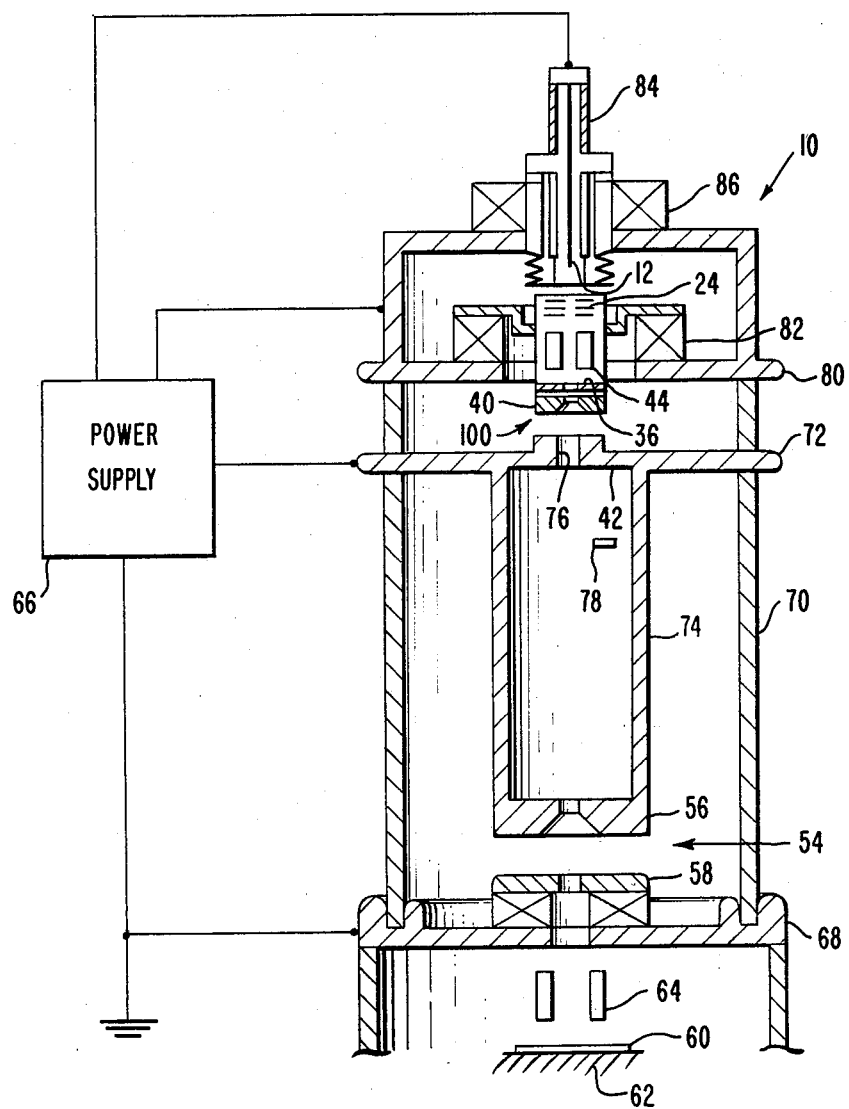
FIG. 4 is a simplified schematic of the column of this invention, showing the principal potentials applied thereto.

The potentials are illustrated with respect to the schematic diagram of column 10 shown in FIG. 4. Starting at the lower end of the column, and at the lower potential, target 60, on stage 62, and the octupole beam deflector 64 are at ground potential. The electronics driving the deflection circuits and the stage positioning are thus at a convenient potential. Power supply 66 is connected to base plate 68 to provide this potential. Of course, small excursions from that potential are experienced by the beam deflector 64. The motors in stage 62 are also suitably powered around the ground potential. Base plate 68 supports insulator tube 70 and isolates the final accelerator-lens potential of the upper flange 72 from the ground. As is seen in FIG. 4, upper flange 72 supports the upper half 56 of the final accelerator lens 54 on drift tube 74. As is seen in the simplified schematic of FIG. 4, upper flange 72 has an opening 76 therein at the potential of upper flange 72 so that the ion beam passing through opening 76 to electrode 56 of the final accelerator lens 54 drifts down through the tube, without acceleration or deflection therein. The purpose of the drift tube is to space the final acceleration lens 54 from the beam focal point at the top of electrode 36 of energy control lens 38. As is seen in FIG. 3, this spacing is needed for focal purposes.

Surrogate target 78 is movable into the beam path as an intermediate target. By reducing the focusing voltage (and thus increasing the focal length) of the first einzel lens 24, the beam can be brought to a focus at target 78 so that the upper portion of the column can be evaluated separately from the high voltage final accelerator lens. Upper flange 72 is connected to the power supply 66 to provide the accelerating voltage, 125 kV in this preferred embodiment. Lower electrode 42 of the energy control lens 38 is at a potential of upper flange 72.

Top flange 80 provides a bulkhead which is at 144 kV at the highest potential in the present example. This is the potential of the aperture plate 36 and the upper electrode 40 in energy control lens 38. Aperture plate 36 is supported on top flange 80 in alignment along the beam path. Support ring 82 supports module 100 which contains aperture plate 36, electrode 40 and ExB separator 44 on top flange 80. The ExB separator 44 is at the potential of the top flange 80. Power supply 66 has a second winding in its high voltage isolation transformer to provide the deflection supplies for the electric field plates 46 and 48. The center element 28 of einzel lens 24 is supplied by a separate negative 30 kV high voltage power supply through a suitable high voltage feedthrough insulator bushing through the top flange.

Power supply 66 is also connected to ion source 12. In the preferred embodiment, the ion source 12 is operated at 6 kV with respect to the top flange 80 for a total maximum of 150 kV with respect to the target. The ion source 12 is insulated from its housing by insulator tube 84 so that it can be supported on support ring 86 with respect to the top flange.

Figure 1:
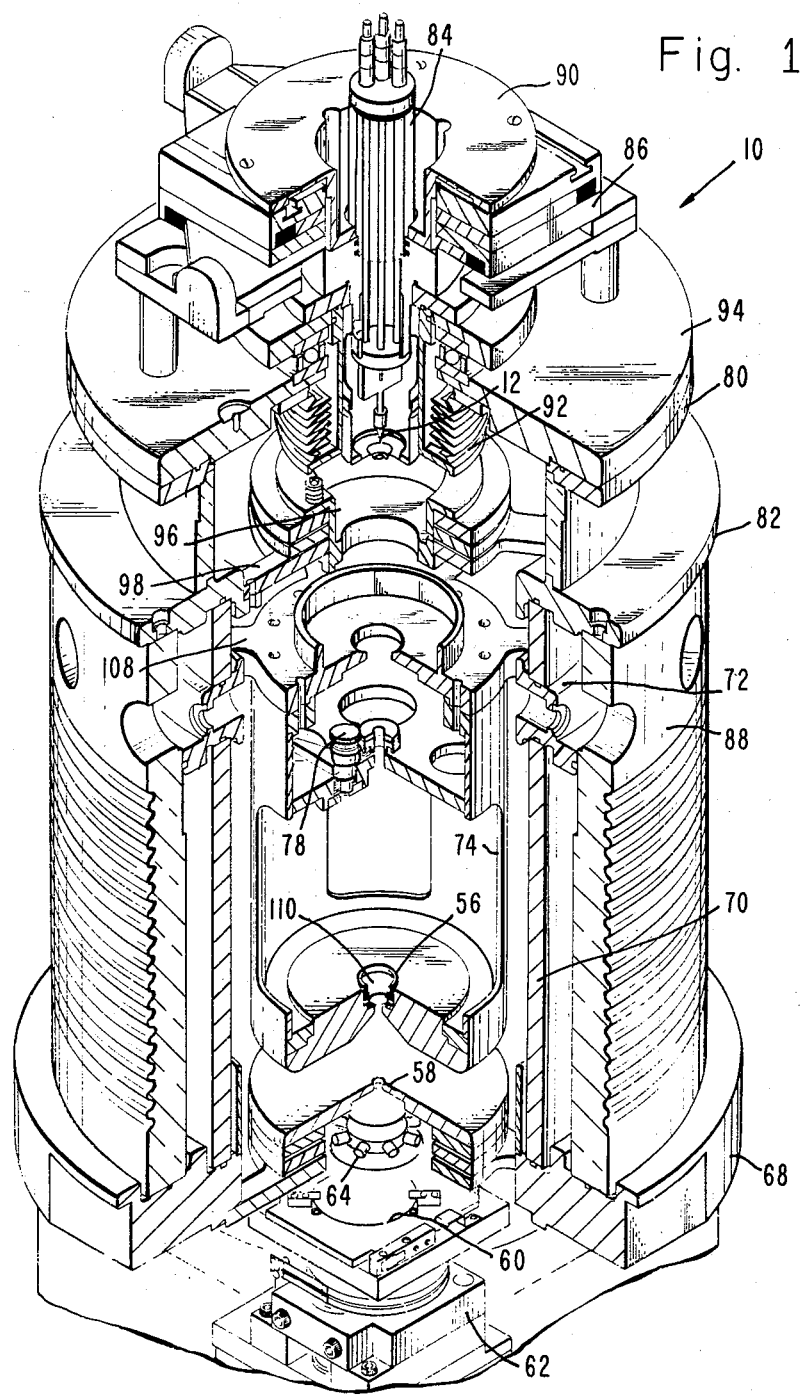
FIG. 1 is a perspective view of the focused ion beam microfabrication column of this invention, taken in section to the axial center line, with one quadrant removed.

The column is shown in overall structural detail in FIG. 1. Insulator tube 70, which withstands the major potential difference between base plate 68 and upper flange 72 is a ceramic cylinder which serves as a vacuum wall so that vacuum can be maintained therein along the beam path. Insulator tube 70 is a cylinder with a sufficiently high insulation value it can stand off the voltage on the vacuum side therein without gradient rings. However, it may not have sufficient mechanical strength and does not have sufficient length to hold off the voltage on the exterior thereof in air. Therefore, tension tube 88 in the form of a cylindrical tube is positioned therein. Tension tube 88 is a glass fiber-epoxy structure which serves as a structural member to seat the O-rings on the ends of tube 70. In addition it is a pressure vessel around insulator tube 70 to provide an annular space therebetween. The annular space is filled with an insulator gas such as Freon 113 or $SF_6$. This provides sufficient breakdown strength along the length of alumina insulator tube 70 on the exterior thereof. Breakdown across the exterior of tension tube 88, which is in air, is prevented by the superior surface breakdown properties of glass fiber-epoxy and by the ribbed convolutions formed on the exterior thereof to increase the surface breakdown path length. An O-ring seals the insulator gas in the annular space. Electrical access to the lower flange electrical connections is provided by windows through the two tubes which are provided with suitable feedthrough bushings and seals.

At the top of the column as seen in FIG. 1, inverted hat-shaped transition piece 90 supports the liquid metal ion source on support ring 86. The support ring is a device which can suitably adjust the ion source 12 with respect to the central axis or beam path of the column 10. Bellows 92 permits lateral motion of ion source 12 and seals the source structure with respect to the main interior volume of the column so that the interior can be evacuated as required. Flange 94 mounts the ion source on top flange 80 at the top of the column.

Figure 2:
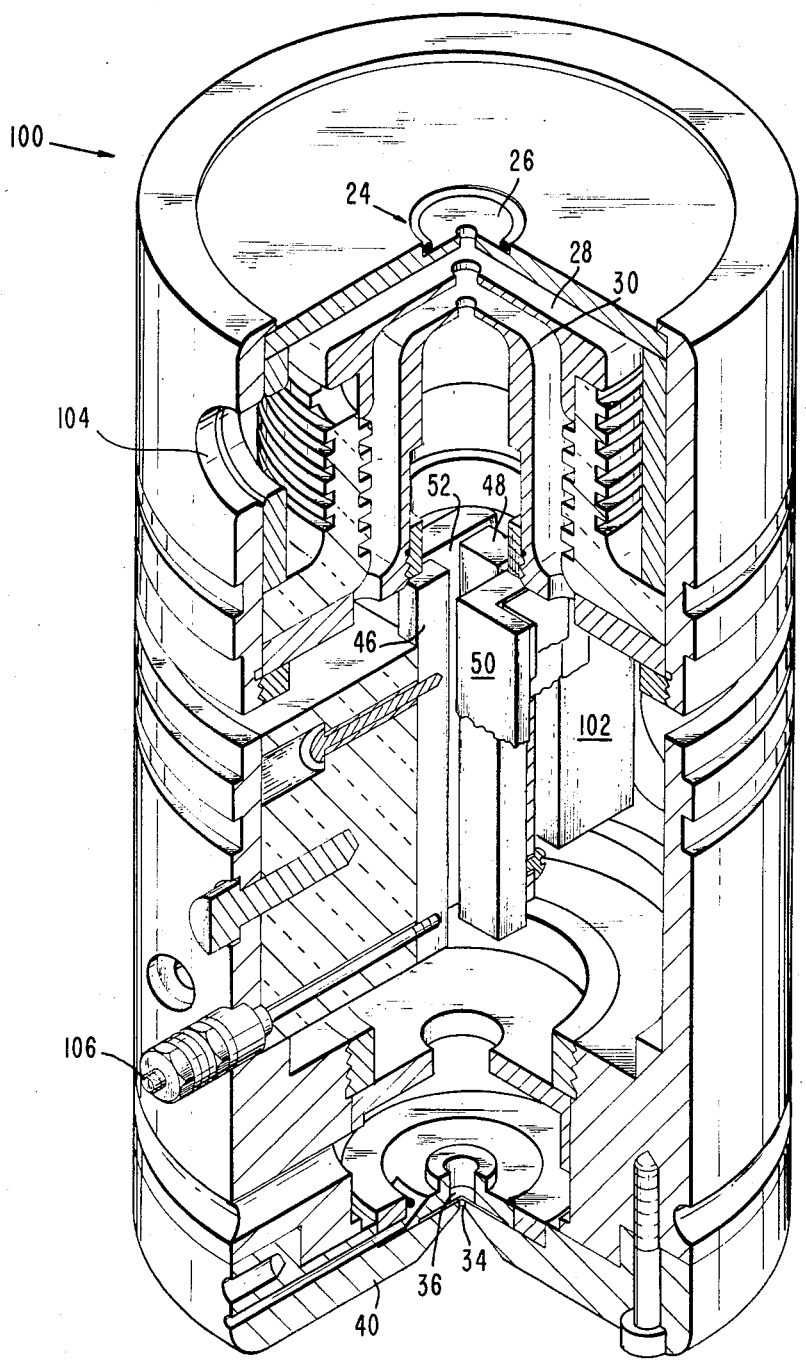
FIG. 2 is a similar view of a subassembly thereof which carries focusing elements and mass separation elements.

Module 100, see FIG. 2, is mounted in ring 96, which is carried on a spider 98 mounted on top flange 80. As is seen in FIG. 2, module 100 contains the electrodes 26, 28 and 30 of the objective einzel lens 24. It also carries therein the electric field plates 46 and 48 as well as the magnetic field pole pieces 50 and 52. Permanent magnet 102 provides the magnetic field. Port 104 provides access to apply the appropriate potential to center electrode 28 of einzel lens 24. Connector 106 and a similar connector on the other side provide separate connections to apply potential to the E plates. With the exception of those potentials, the entire module 100 operates at the voltage of top flange 80, 144 kV in the present example. The center element 28 of the einzel lens and the E plates are related to that flange voltage as excursions therefrom.

The upper element 40 of the energy control lens 38 operates at 144 kV maximum, and this is the lower plate in module 100 in FIG. 2. Above lower plate 40 in module 100 and closely spaced therefrom is the aperture plate 36. The small opening 34 in that plate is the mass separator opening, and the flat upper plane of the aperture plate 36 is at the focal point of the beam as focused by objective lens 24. It is by positioning the aperture plate 36 at the focal plane that maximum separation is achieved. It is by positioning the ExB separator in the lower energy region between lenses 24 and 38 that maximum deflection of unwanted ions can be achieved with minimum field strength, and thus minimum perturbation of the path of the desired ions.

As is seen in FIG. 1, tension tube 88 is bolted to top flange 80 and it is also secured to base plate 68 to secure that structure into one assembly. The upper flange 72 carries drift tube 74 on spider 108, and the upper element 56 of final accelerator lens 54 is carried on the lower end of drift tube 74, see FIG. 1. The open areas between the arms of the spider and in both the upper and lower flanges permit vacuum pumping of the upper portion of the column and the source from the bottom of the column. Preferably, the entire column is pumped from the bottom through the target chamber. The region within drift tube 74 is a drift region where the beam expands from a waist of about 2 micrometers to a diameter of about 250 mincrometers. This is the normal spreading of the beam beyond the focal point at the top surface of aperture plate 36. At the lower end of the drift region, aperture 110 in the electrode 56 insures that the beam passes through the center of the final lens. The majority of the energy gain occurs in the final lens across the gap between electrodes 56 and 58. Beam deflector 64 below the final accelerator lens 54 provides the final scan deflection of the beam across the wafer target 60. This deflector must deflect the beam at its full potential and provide the speed and precision necessary for microfabrication.

Final beam energy is changed by changing the final lens accelerating potential between electrodes 56 and 58. Focus is maintained by controlling the potential on the energy control lens electrodes 40 and 42 so that the beam energy out of electrode 42 is a constant fraction of total beam energy. The following table illustrates a six to one potential ratio for a preferred embodiment.

| Source extraction energy 12-20 | Pre-Control 40-42 | Final Accel 56-58 | Total beam energy 12-58 |
| --- | --- | --- | --- |
| 6 Kv | 0 kV | 30 kV | 36 kV |
| 6 | 9 | 75 | 90 |
| 6 | 14 | 100 | 120 |
| 6 | 19 | 125 | 150 |

By thus changing the beam energy, depth of implantation can be controlled and sputter machining can be done.

This invention has been described in its presently contemplated best mode and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A mass separated, focused ion beam microfabrication system for forming a high resolution, direct-write ion beam having a small spot size and high current density at a target, comprising:

a high intensity, substantially point source of a desired species of ions, means for extracting an angularly expanding ion beam from the source at an initial energy leval which is low compared to the final beam energy, a low aberration focusing means positioned to focus the beam to a crossover without substantially increasing the beam energy, a mass separator positioned in the beam path between the focusing means and the beam crossover to deflect undesired ion species out of the beam path, the mass separator operating with relatively weak fields corresponding to the relatively low initial beam energy, and thereby imparting little aberration to the beam, an energy control means comprising a pair of spaced electrodes positioned in the vicinity of the beam crossover for accelerating the beam ions to an intermediate energy level without substantially changing the beam focus, the energy control means thereby avoiding any substantial increase in beam aberration.

an electrostatic focus/accelerating means comprising a pair of spaced electrodes positioned in the beam path beyond the crossover, a variable power supply means connected to apply respective voltage differentials across the energy control and focus/accelerating electrodes sufficient to focus the beam to a small spot with a high current density and to establish the energy of the beam emerging from the energy control meas, relative to the ion source, at a substantially constant fraction of the beam energy emerging from the focus/accelerating means, and at a changing fraction of the beam energy emerging from the extraction means as the power supply is varied, and means for deflecting the spot over a target in a desired manner to implant a desired ion pattern on the target.

2. The focused ion beam microfabrication system of claim 1, wherein the power supply means is capable of applying respective voltage differentials across the energy control and focus/accelerating electrodes sufficient to accelerate the beam to a single ion energy level of about 150 KeV.

3. The focused ion beam microfabrication system of claim 1, the extraction means comprising an extraction electrode connected to receive substantially the same voltage from the power supply means as the upstream electrode of the energy control means, and the downstream electrode of the energy control means being connected to receive substantially the same voltage as the upstream electrode of the focus/accelerating means.

4. A method of forming a high resolution, focused ion beam having a small spot size and a high current density at a target for direct-write microfabrication, comprising the steps of:

forming an angularly expanding beam of a desired ion species at an initial relatively low energy level, focusing the beam to a crossover without substantially increasing its energy, means separating the beam with relatively weak fields to deflect undesired ion species out of the beam path, accelerating the mass separated beam in the vicinity of the beam crossover to an intermediate energy level without substantially changing the beam focus, electrostatically focusing and accelerating the beam beyond the crossover to a small spot with a high current density, varying the intermediate beam energy level as a substantially constant fraction of the final beam energy and as a changing fraction of the initial beam energy, and deflecting the spot over a target to implant a desired ion pattern on the target.

5. The method of claim 4, wherein the beam is electrostatically accelerated beyond the crossover to a single ion energy level of about 150 KeV in the course of varying the intermediate beam energy level.

* * * * *